United States Patent
Funaba

(10) Patent No.: US 10,663,920 B2
(45) Date of Patent: May 26, 2020

(54) IMAGE FORMING APPARATUS AND FAN OPERATION CONTROLLING METHOD

(71) Applicant: CANON KABUSHIKI KAISHA, Tokyo (JP)

(72) Inventor: Hiroshi Funaba, Moriya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/405,969

(22) Filed: May 7, 2019

(65) Prior Publication Data

US 2019/0354068 A1 Nov. 21, 2019

(30) Foreign Application Priority Data

May 15, 2018 (JP) ................ 2018-093655

(51) Int. Cl.
*G03G 21/20* (2006.01)
*H05K 7/20* (2006.01)

(52) U.S. Cl.
CPC ....... *G03G 21/206* (2013.01); *H05K 7/20172* (2013.01); *H05K 7/20209* (2013.01)

(58) Field of Classification Search
CPC ................ G03G 21/206; G03G 2221/1645
See application file for complete search history.

(56) References Cited

U.S. PATENT DOCUMENTS

| 2006/0071623 A1* | 4/2006 | Able | G06F 1/206 |
| | | | 318/268 |
| 2007/0098374 A1 | 5/2007 | Fujiwara | |
| 2014/0056608 A1* | 2/2014 | Miura | G03G 15/205 |
| | | | 399/92 |

* cited by examiner

*Primary Examiner* — Sandra Brase
(74) *Attorney, Agent, or Firm* — Venable LLP

(57) ABSTRACT

Provided is an image forming apparatus including: an image forming unit configured to form an image on a recording material; an exhaust fan configured to exhaust air inside the image forming apparatus; a CPU configured to control rotation of the exhaust fan; and a memory configured to store in advance a first control setting value for rotating the exhaust fan at a first target rotation speed. The CPU rotates the exhaust fan based on the first control setting value, and permits the image forming unit to form an image when a rotation speed of the exhaust fan becomes equal to or faster than a lower limit rotation speed for suppressing a discharge amount of UFPs. When a predetermined time period has elapsed, the CPU performs feedback control for the exhaust fan such that the exhaust fan is rotated faster than the first target rotation speed.

12 Claims, 6 Drawing Sheets

IMAGE FORMING APPARATUS AND FAN OPERATION CONTROLLING METHOD

BACKGROUND OF THE INVENTION

Field of the Invention

The present disclosure relates to an image forming apparatus, for example, a copying machine, a printer, or a facsimile machine, and more particularly, to control of a fan motor provided inside an image forming apparatus.

Description of the Related Art

An image forming apparatus includes an exhaust fan motor (hereinafter referred to as "exhaust fan") for suppressing an increase in temperature inside the image forming apparatus. The exhaust fan exhausts heated air inside the image forming apparatus. At a time of exhausting air, fine particles and the like may be discharged along with air. Such fine particles and the like are required to be reduced from the viewpoint of environmental protection. For example, in "Blue Angel", German certification for products and services, a discharge amount of ultra-fine particles (UFPs), which are ultra-fine particles discharged from a product, is regulated. Therefore, the image forming apparatus is required to limit a UFP discharge amount by, for example, providing a dedicated filter in an exhaust path and exhausting air through the filter.

However, when air is exhausted through the filter, a loss of air flow occurs, and an effect of suppressing an increase in temperature inside the image forming apparatus is lowered. In order to lower the temperature inside the image forming apparatus in the same manner as in a case of providing no filter, for example, it is required to increase an air flow by increasing a rotation speed of the exhaust fan. However, as the rotation speed increases, the exhaust fan emits louder noise due to wind noise generated by itself and acoustic echo inside a duct. In order to solve those problems, it is required to control the rotation speed of the exhaust fan with high accuracy within a limited predetermined range of the rotation speed.

In order to control the rotation speed of the exhaust fan at a predetermined rotation speed, a pulse width modulation signal (hereinafter referred to as "PWM signal") may be used. When the PWM signal is used, the exhaust fan has the rotation speed controlled by adjusting a cycle period of the PWM signal and a duty ratio of a pulse width. For example, in United States Patent Application Publication No. 2007/0098374 A1, there is disclosed a technology for performing feedback control for the exhaust fan by detecting a rotational speed of the exhaust fan and adjusting the duty ratio of the PWM signal in accordance with the detected rotational speed.

As the exhaust fan has a larger size, the air flow at the same rotation speed increases. The weight and inertia of the exhaust fan increase in proportion to a rotor size of the exhaust fan. Therefore, when the rotation speed is controlled to be constant by the PWM signal, the exhaust fan requires time until the rotation speed reaches a target rotation speed to become stable. When such feedback control as described above is started until the rotation speed becomes stable, there is a possibility that the duty ratio of the PWM signal may be adjusted before the rotation speed reaches the target rotation speed. Therefore, the feedback control is required to be started after the rotation speed reaches the target rotation speed and becomes stable.

Even when there is no change in duty ratio of the PWM signal, the exhaust fan may cause a variation in rotation speed due to individual differences in winding resistance value, rotor balance, and other such characteristics and tolerance of a power supply voltage. For example, the exhaust fan causes a variation of about ±10% in rotation speed due to the individual differences in characteristics, and a variation of about ±5% to 10% in rotation speed due to the tolerance of the power supply voltage. FIG. 7 is an explanatory graph of temporal changes in rotation speed exhibited until the rotation speed of the exhaust fan reaches the target rotation speed based on the PWM signal. In FIG. 7, a target control range is set to ±5% with respect to the target rotation speed. The variation in characteristics of the exhaust fan is ±15%. In this case, there is a possibility that the rotation speed may exceed the target control range during a speed stabilizing time period after the exhaust fan starts to rotate until becoming stable and during a period after the feedback control is started until the rotation speed is controlled to fall within the target control range.

The image forming apparatus includes a nonvolatile memory configured to store the duty ratio of the PWM signal for controlling the rotation speed to fall within the target control range. The duty ratio of the PWM signal is, for example, a duty ratio for correcting a difference between the rotation speed including a variation factor of the exhaust fan, which is measured before shipment, and the target rotation speed. The image forming apparatus controls the rotation of the exhaust fan by adjusting the PWM signal in accordance with the duty ratio stored in the nonvolatile memory.

However, when the exhaust fan or the power supply unit is replaced due to, for example, a failure, the variation factor of the rotation speed changes. In this case, there is a possibility that, with content stored in the nonvolatile memory, it may become unable to control the rotation speed of the exhaust fan to fall within the target control range. This necessitates processing for calculating the duty ratio of the PWM signal for correcting the difference from the target rotation speed in accordance with the rotation speed including the variation factor even when a component is replaced in the same manner in the case before shipment. However, work of this processing requires the speed stabilizing time period. This increases a time period required for replacement and adjustment performed after shipment.

There is also a possibility that the image forming apparatus may unintentionally discharge UFPs when an operation for image forming processing is started before the rotation speed of the exhaust fan reaches the target rotation speed. For example, when a rotational speed of the exhaust fan is lower than a speed of a target value, there is a possibility that an amount of air exhausted through the filter may decrease and a static pressure of an exhaust path may decrease, to thereby discharge UFPs from an unintended portion of the image forming apparatus. When the rotational speed of the exhaust fan is faster than the speed of the target value, the noise becomes louder.

For that reason, when the image formation is performed on condition that the rotation speed of the exhaust fan has been controlled to fall within the target control range by the feedback control, a large amount of time is required until the first printed product is output. Therefore, the present disclosure provides an image forming apparatus configured to appropriately control the rotation of an exhaust fan.

SUMMARY OF THE INVENTION

An image forming apparatus according to the present disclosure includes: an image forming unit configured to form an image on a recording material; a fan configured to exhaust air inside the image forming apparatus; a controller configured to control rotation of the fan; and a storage configured to store in advance a first control setting value for rotating the fan at a first target rotation speed, wherein the controller is configured to: rotate the fan based on the first control setting value; permit the image forming unit to form an image in a case where the rotation speed of the fan becomes equal to or faster than a predetermined lower limit rotation speed; and perform feedback control for the fan such that the fan is rotated at a second rotation speed, which is faster than the first target rotation speed, in a case where a state of the fan satisfies a predetermined start condition, and wherein a discharge amount of fine particles is suppressed to an amount equal to or smaller than a predetermined amount under a state in which the fan is being rotated at the predetermined lower limit rotation speed.

Further features of the disclosure will become apparent from the following description of exemplary embodiments (with reference to the attached drawings).

DESCRIPTION OF THE EMBODIMENTS

An image forming apparatus according to an embodiment of the present disclosure is described with reference to the accompanying drawings.

Figure 1:
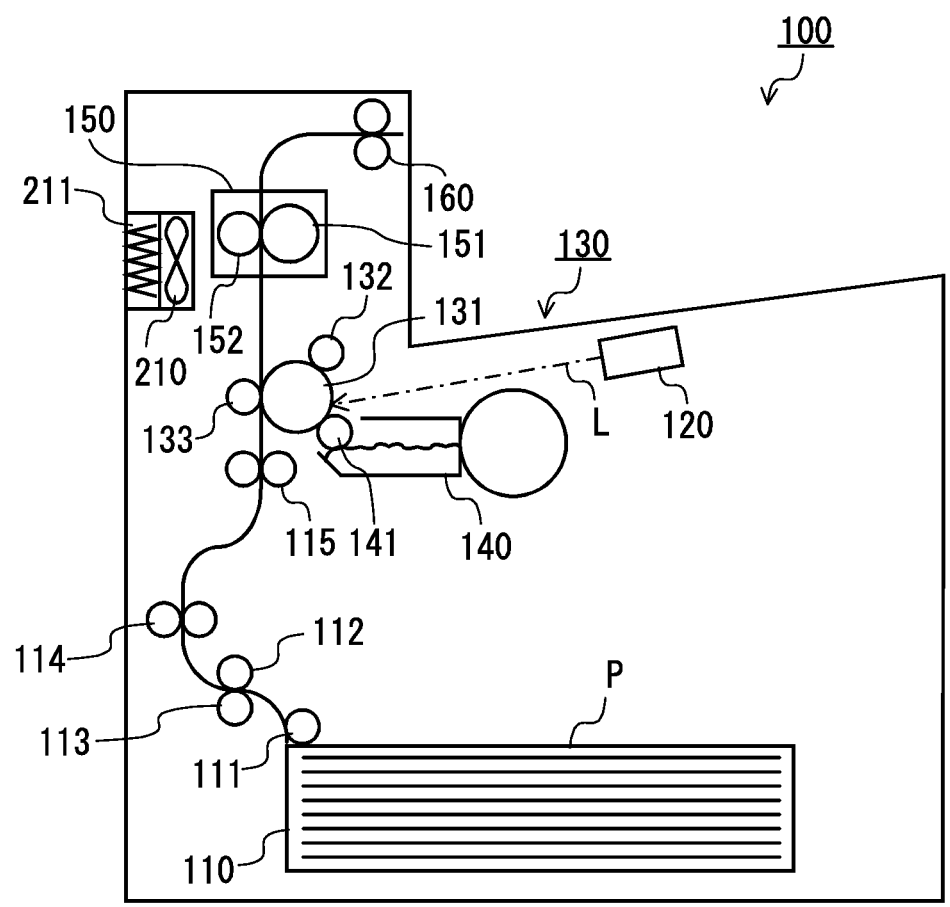
FIG. 1 is a configuration diagram of a printer according to one embodiment of the present disclosure.

FIG. 1 is a configuration diagram of a printer serving as an image forming apparatus according to this embodiment. A printer 100 includes a sheet feeding cassette 110 capable of receiving a plurality of recording materials (or sheets of recording paper) P, for example, sheets, a conveyance path for conveying the recording material P, an image forming unit 130 configured to form an image on the recording material P, a fixing device 150, and an exhaust fan 210 for suppressing an increase in temperature inside the printer 100. In order to feed the recording material P, the conveyance path includes a pickup roller 111, a sheet feeding roller 112, a retard roller 113, a conveyance roller pair 114, a registration roller pair 115, and a discharge roller pair 160. The image forming unit 130 includes a photosensitive drum 131, a charging roller 132, a laser scanner unit 120, a developing device 140, and a transfer roller 133. The developing device 140 includes a developing roller 141. The fixing device 150 includes a fixing roller 151 and a pressure roller 152. The exhaust fan 210 includes a filter 211 in a direction in which air is exhausted.

The pickup roller 111 picks up the recording materials P received in the sheet feeding cassette 110, and feeds the recording materials P to the sheet feeding roller 112. The sheet feeding roller 112 and the retard roller 113 separate the recording materials P fed from the pickup roller 111 into one sheet. The recording materials P are fed sheet by sheet along the conveyance path by the pickup roller 111, the sheet feeding roller 112, and the retard roller 113. The recording material P, which has been obtained by separating the recording materials P into one sheet, is conveyed to the registration roller pair 115 by the conveyance roller pair 114. The registration roller pair 115 is stopped while the recording material P is being conveyed. The recording material P is brought into abutment with a nip portion of the stopped registration roller pair 115 to form a loop. With this configuration, the recording material P is subjected to correction of skew feeding.

In synchronization with the feeding of the recording material P, the image forming unit 130 forms an image (toner image) on the photosensitive drum 131. The photosensitive drum 131, which is a photosensitive member having a drum shape, is rotated in a clockwise direction in FIG. 1, and has an outer peripheral surface charged uniformly to a potential of a predetermined polarity by the charging roller 132. The laser scanner unit 120 scans the charged photosensitive drum 131 with a laser beam L modulated based on an image signal representing an image to be formed. An electrostatic latent image is formed on the photosensitive drum 131 by the scanning with the laser beam L. The developing device 140 causes the developing roller 141 to develop the electrostatic latent image formed on the photosensitive drum 131. By the development, a toner image is formed on the photosensitive drum 131. The toner image is conveyed toward the transfer roller 133 side in accordance with the rotation of the photosensitive drum 131.

The registration roller pair 115 starts to convey the recording material P so that the recording material P reaches the transfer roller 133 at a timing when the toner image is conveyed to the transfer roller 133. The transfer roller 133 electrostatically transfers the toner image on the photosensitive drum 131 onto the recording material P by being applied with a transfer bias reverse in polarity to that of the photosensitive drum 131. The recording material P onto which the toner image has been transferred is conveyed to the fixing device 150.

The fixing device 150 forms a nip portion by the fixing roller 151 and the pressure roller 152. The recording material P has the toner image heated, melted, and pressurized at the nip portion, to thereby have the image fixed thereto. The recording material P to which the image has been fixed is conveyed to the discharge roller pair 160. The discharge roller pair 160 delivers the recording material P to the outside of the printer 100. The printer 100 performs an operation for image forming processing in the above-mentioned manner.

The exhaust fan 210 exhausts heat by discharging the air heated by, for example, the fixing device 150 to the outside of the printer 100. The exhaust fan 210 exhausts air to the outside through the filter 211. The filter 211 collects ultra-fine particle (UFP) dust contained in the exhausted air.

Figure 2:
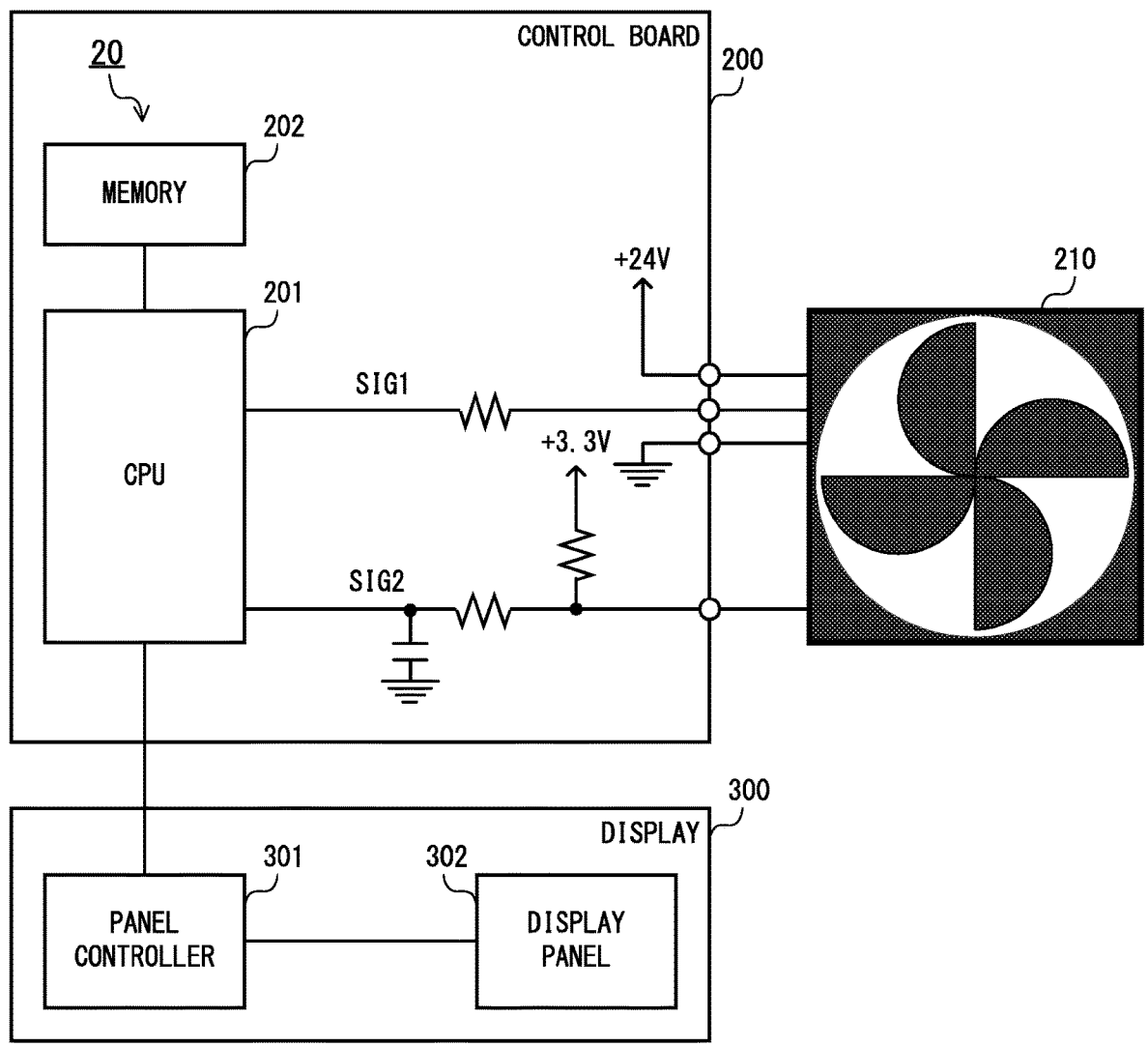
FIG. 2 is an explanatory diagram of a fan controller.

FIG. 2 is an explanatory diagram of a fan controller configured to control an operation of the exhaust fan 210. The fan controller 20 is mounted to a control board 200 in the printer 100, and includes a central processing unit (CPU) 201 and a memory 202. The CPU 201 executes a predetermined computer program to control an operation of the printer 100. The description of this embodiment is mainly given of a function of controlling, by the CPU 201, the operation of the exhaust fan 210. The memory 202 is a nonvolatile memory configured to store, for example, a control setting value including a target value of a rotation speed (target rotation speed) of the exhaust fan 210. The CPU 201 is also connected to a display 300. The display 300 includes a panel controller 301 and a display panel 302.

The exhaust fan 210 is applied with a voltage of 24 V as the power supply voltage. The power supply voltage is a DC voltage generated by an DC power supply (not shown) included in the printer 100, and has a tolerance of ±5%.

The CPU 201 outputs a pulse modulation signal (PWM signal) SIG1 as a rotation command signal to the exhaust fan 210. The exhaust fan 210 is rotated at the rotation speed, i.e., the number of revolutions per unit time, corresponding to the PWM signal SIG1. The exhaust fan 210 outputs a frequency generator (FG) signal SIG2 being a pulse signal corresponding to the rotation speed. The FG signal SIG2 is input to the CPU 201. The CPU 201 can measure the rotation speed of the exhaust fan 210 by measuring a cycle period of the FG signal SIG2 acquired from the exhaust fan 210. The CPU 201 performs feedback control for the rotational operation of the exhaust fan 210 depending on a difference between the target rotation speed stored in the memory 202 and the measured rotation speed of the exhaust fan 210. In the feedback control, the CPU 201 changes a duty ratio of the PWM signal SIG1 depending on the difference between the target rotation speed and the measured rotation speed of the exhaust fan 210 so that the rotation speed of the exhaust fan 210 reaches the target rotation speed.

The CPU 201 and the panel controller 301 perform serial communication to/from each other. The CPU 201 controls an operation of the panel controller 301 to display, on the display panel 302, the operation state of the printer 100 and a notification of an abnormality when the abnormality occurs. The display panel 302 is a liquid crystal display or other such display devices.

Figure 3:
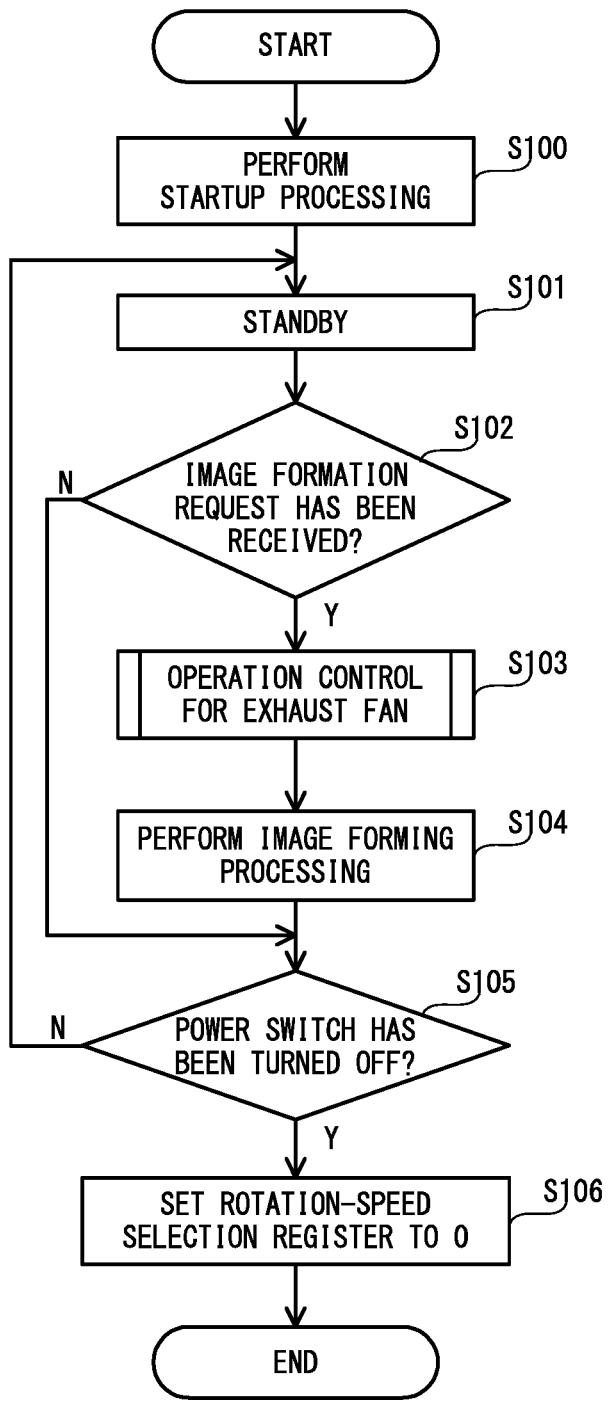
FIG. 3 is a flow chart for illustrating image forming processing.

FIG. 3 is a flow chart for illustrating the image forming processing including operation control processing for the exhaust fan 210 performed by the printer 100 configured as described above. This processing is started when a power switch of the printer 100 is turned on.

When the power switch of the printer 100 is turned on, the CPU 201 performs startup processing (Step S100). After completing the startup processing, the CPU 201 shifts the operating state of the printer 100 to a standby state (Step S101). When the printer 100 is shifted to the standby state, the CPU 201 stands by to receive an image formation request from an external apparatus or an operation panel (not shown) (Step S102).

When the image formation request is acquired (Y in Step S102), the CPU 201 performs operation control for the exhaust fan 210 (Step S103). The operation control processing for the exhaust fan 210 is described later in detail. The CPU 201 performs the image forming processing based on the image formation request (Step S104). When the image forming processing is completed, the CPU 201 determines whether or not the power switch has been turned off (Step S105). When the power switch has not been turned off (N in Step S105), the CPU 201 returns the operation state of the printer 100 to the standby state, and stands by to receive an image formation request. When the CPU 201 has not received an image formation request (N in Step S102), the CPU 201 determines whether or not the power switch has been turned off (Step S105), and when the power switch has not been turned off, maintains the standby state.

When the power switch has been turned off (Y in Step S105), the CPU 201 sets a value of the rotation speed selection register to be stored in the memory 202 to "0", and brings the processing to an end (Step S106). The rotation speed selection register is a register for selecting the target rotation speed of the exhaust fan 210. The CPU 201 determines, based on the value of the rotation speed selection register, the target rotation speed of the exhaust fan 210 to be used next time the power switch is turned on. When the value of the rotation speed selection register is "0", the target rotation speed of the exhaust fan 210 at the time of the next startup is, for example, 2,500 rpm.

Figure 4:
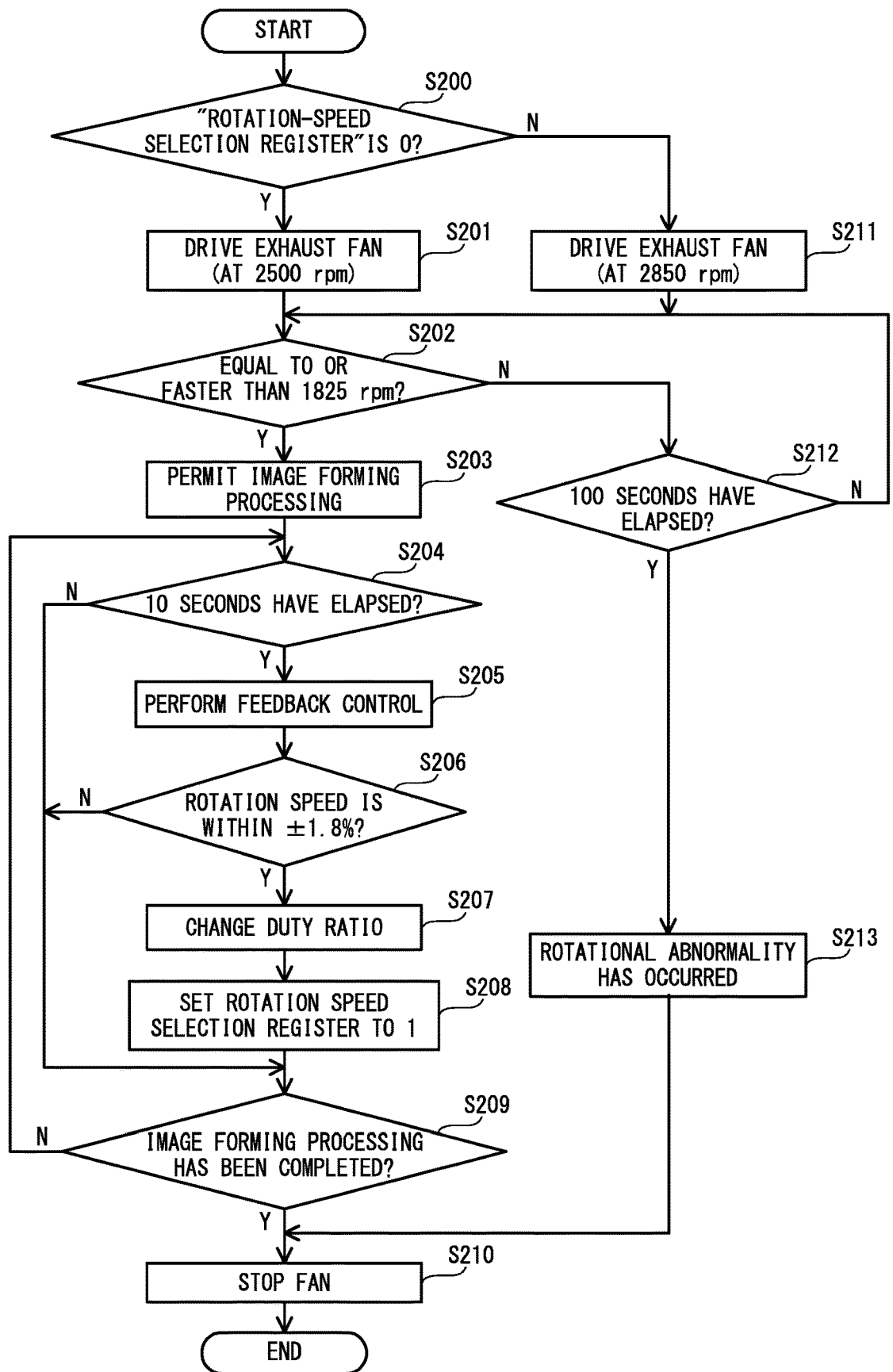
FIG. 4 is a flow chart for illustrating operation control processing for an exhaust fan.

FIG. 4 is a flow chart for illustrating the operation control processing for the exhaust fan 210 of Step S103.

The CPU 201, which has started the operation control for the exhaust fan 210, refers to the memory 202 to examine the value of the rotation speed selection register (Step S200). When the value of the rotation speed selection register is "0" (Y in Step S200), the CPU 201 outputs the PWM signal SIG1 for rotating the exhaust fan 210 so that the rotation speed reaches 2,500 rpm being a first target rotation speed, to thereby rotationally drive the exhaust fan 210 (Step S201). The duty ratio of the PWM signal SIG1 corresponding to the first target rotation speed is stored in advance in the memory 202. The CPU 201 generates and outputs the PWM signal SIG1 based on the duty ratio stored in the memory 202. For example, the rotation speed selection register has a value of "0" when an image is formed for the first time after the power switch is turned on. In this case, the temperature inside the printer 100 is relatively low, and hence it is possible to suppress the increase in temperature inside the printer 100 even when the rotation speed of the exhaust fan 210 is suppressed. Therefore, the first target rotation speed is set to the rotation speed lower than a second target rotation speed described later. The CPU 201 causes a timer (not shown) to count a time period from a start of the rotation of the exhaust fan 210.

The CPU 201 detects the rotation speed of the exhaust fan 210 based on the FG signal SIG2 (Step S202). When detecting that the rotation speed of the exhaust fan 210 has become equal to or faster than 1,825 rpm being a first lower limit rotation speed (Y in Step S202), the CPU 201 permits the image forming processing to be started (Step S203). The first lower limit rotation speed is a lower limit rotation speed for suppressing a discharge amount of UFPs to an amount equal to or smaller than a predetermined amount. The CPU 201 executes the processing of Step S104 in FIG. 3 by permitting to start the image forming processing. The subsequent processing is performed in parallel with the processing of Step S104.

The CPU 201 examines whether or not the time period of 10 seconds has elapsed since the start of the rotation of the exhaust fan 210 (Step S204). The time period of 10 seconds is a stabilizing time period sufficient for rotating the exhaust fan 210 with stability at 2,500 rpm being the first target rotation speed. When the time period of 10 seconds has elapsed (Y in Step S204), the CPU 201 starts the feedback control for the exhaust fan 210 (Step S205). The CPU 201 changes the duty ratio of the PWM signal SIG1 depending on a result of measuring the rotation speed of the exhaust fan 210, to thereby perform the feedback control for the exhaust fan 210 so that the rotation speed reaches 2,850 rpm being the second target rotation speed.

When the rotation speed of the exhaust fan 210 reaches within a predetermined range (in this case, within ±1.8%) with respect to 2,850 rpm (Y in Step S206), the CPU 201 changes the duty ratio of the PWM signal SIG1. In this case, the CPU 201 changes the duty ratio of the PWM signal SIG1 to a value at a time of setting 2,850 rpm, which is stored in advance in the memory 202 (Step S207). The value at the time of setting 2,850 rpm, which is stored in advance in the memory 202, is a duty ratio of the PWM signal for correcting the difference between the rotation speed including a variation factor of the exhaust fan 210, which is measured before shipment of the printer 100, and the target rotation speed. After changing the duty ratio, the CPU 201 sets the value of the rotation speed selection register to "1" (Step S208). The CPU 201 repeatedly performs the processing of from Step S204 to Step S208 until the image forming processing is completed (N in Step S209). With this processing, the rotation speed of the exhaust fan 210 is controlled within the range of ±1.8% with respect to 2,850 rpm being the second target rotation speed.

When the image forming processing is completed (Y in Step S209), the CPU 201 stops the exhaust fan 210 to bring the operation control processing for the exhaust fan 210 to an end (Step S210).

When the time period of 10 seconds has not elapsed since the start of the rotation of the exhaust fan 210 (N in Step S204), the CPU 201 repeatedly performs the processing of from Step S204 to Step S208 until the image forming processing is completed (N in Step S209). Meanwhile, when the rotation speed of the exhaust fan 210 does not fall within ±1.8% with respect to 2,850 rpm (N in Step S206), the CPU 201 repeatedly performs the processing of from Step S204 to Step S206 until the image forming processing is completed (N in Step S209). Also in those cases, when the image forming processing is completed (Y in Step S209), the CPU 201 stops the exhaust fan 210 to bring the operation control processing to an end (Step S210).

As described above, when the duty ratio of the PWM signal SIG1 is changed to the value at the time of setting 2,850 rpm, which is stored in advance in the memory 202, the value of the rotation speed selection register is set to "1" in the processing of Step S208. Therefore, during the subsequent operation control processing for the exhaust fan 210, the CPU 201 performs the processing set to be performed when the value of the rotation speed selection register is "1" (N in Step S200). In this case, the CPU 201 outputs the PWM signal SIG1 for rotating the exhaust fan 210 so that the rotation speed reaches 2,850 rpm being the second target rotation speed, to thereby rotationally drive the exhaust fan 210 (Step S211). That is, at times of the image forming processing for the second and subsequent iterations, the CPU 201 starts the rotational drive of the exhaust fan 210 at the second target rotation speed. The duty ratio of the PWM signal SIG1 corresponding to the second target rotation speed is stored in advance in the memory 202. The CPU 201 generates and outputs the PWM signal SIG1 based on the duty ratio stored in the memory 202. After that, the CPU 201 executes the processing of from Step S202 to Step S210.

When the rotation speed of the exhaust fan 210 has not become equal to or faster than 1,825 rpm (N in Step S202), the CPU 201 examines whether or not a time period of 100 seconds has elapsed since the start of the rotation of the exhaust fan 210 (Step S212). When the time period of 100 seconds has not elapsed (N in Step S212), the CPU 201 continues to monitor the rotation speed of the exhaust fan 210 (Step S202).

When the rotation speed has not become equal to or faster than 1,825 rpm even after the time period of 100 seconds has elapsed since the start of the rotation of the exhaust fan 210 (Y in Step S212), the CPU 201 determines that a rotational abnormality has occurred in the exhaust fan 210 (Step S213). That is, when the rotation speed of the exhaust fan 210 has not become equal to or faster than 1,825 rpm within 100 seconds after a start of the rotational drive, the CPU 201 determines that the exhaust fan 210 is abnormal. The CPU 201 instructs the display 300 to notify that a rotational abnormality has occurred in the exhaust fan 210. The panel controller 301 of the display 300 displays the rotation abnormality of the exhaust fan 210 on the display panel 302 based on this instruction. The CPU 201 stops the exhaust fan 210 after the notification to bring the operation control processing for the exhaust fan 210 to an end (Step S210).

Figure 5A:
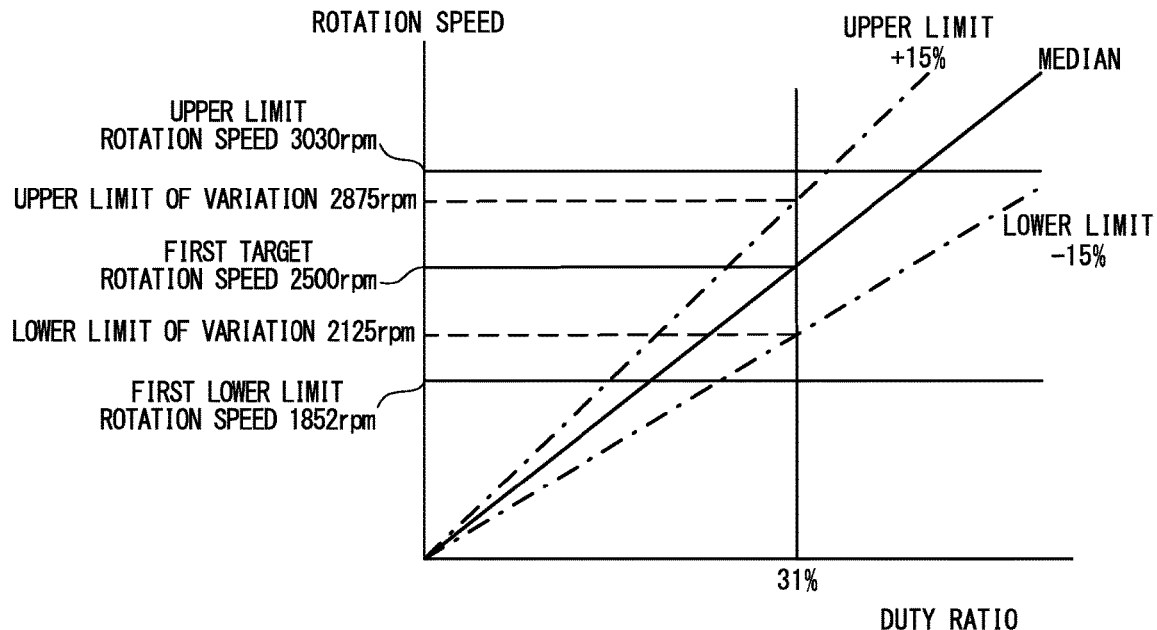
FIG. 5A and FIG. 5B are each an explanatory graph of a relationship between a duty ratio of a PWM signal and a rotation speed of the exhaust fan.
Figure 5B:
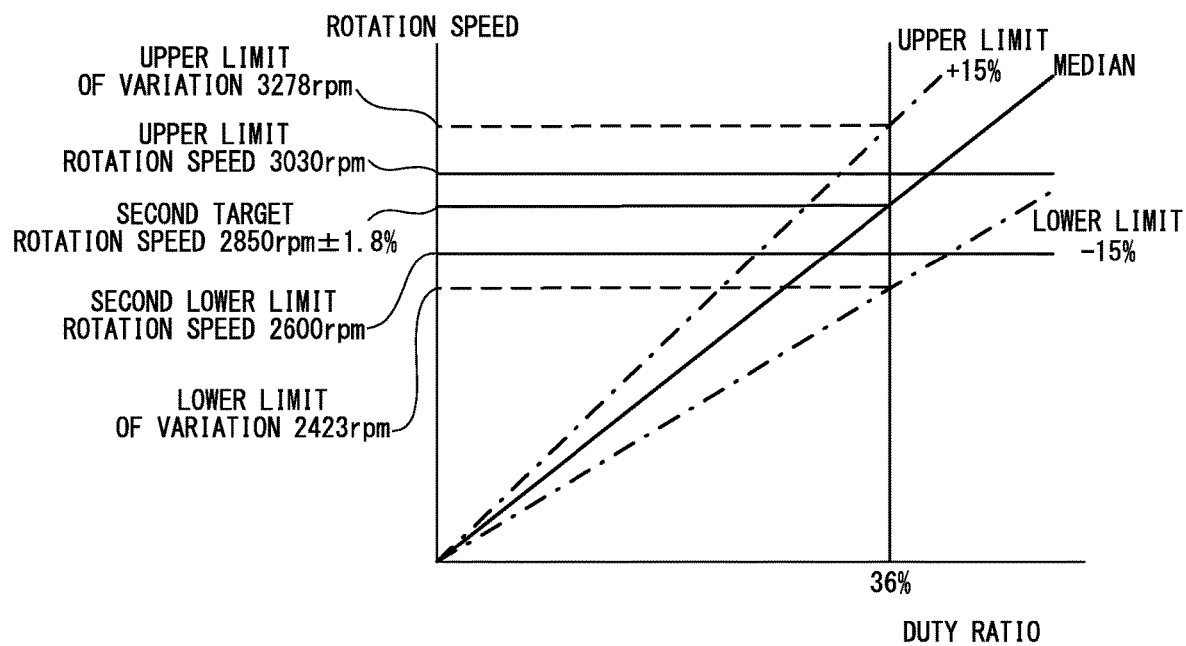

FIG. 5A and FIG. 5B are each an explanatory graph of a relationship between the duty ratio of the PWM signal SIG1 and the rotation speed of the exhaust fan 210 in this embodiment.

Constraint conditions for the rotation speed of the exhaust fan 210 are the first lower limit rotation speed for suppressing a UFP discharge amount, a second lower limit rotation speed for suppressing the increase in temperature inside the printer 100, and an upper limit rotation speed for suppressing noise emitted from the printer 100 to a level equal to or lower than a predetermined level. The first lower limit rotation speed in this embodiment is 1,852 rpm. The second lower limit rotation speed in this embodiment is 2,600 rpm. The upper limit rotation speed in this embodiment is 3,030 rpm.

In a case where the exhaust fan 210 is being rotated at a speed equal to or slower than the first lower limit rotation speed, the UFP discharge amount increases when the image forming processing is executed. Therefore, the first lower limit rotation speed is a condition for determining whether or not the image forming processing can be performed. The image forming processing is not permitted unless the rotation speed becomes equal to or faster than the first lower limit rotation speed. The second lower limit rotation speed is the rotation speed that can suppress the increase in temperature inside the printer 100 when the image formation is performed continuously. The increase in temperature inside the printer 100 is relatively small until a predetermined time period has elapsed since the start of the image formation. Therefore, the rotation speed of the exhaust fan 210 may fall below the second lower limit rotation speed during a time period until the rotation of the exhaust fan 210 becomes stable and the feedback control is started.

FIG. 5A is a graph for showing a relationship between the duty ratio of the PWM signal SIG1 used when the exhaust fan 210 is rotated at 2,500 rpm being the first target rotation speed and the rotation speed. The first target rotation speed is the rotation speed set during a predetermined time period after the start of the image formation, and is therefore a value below the second lower limit rotation speed. The duty ratio of the PWM signal SIG1 and the rotation speed are in a proportional relationship. In FIG. 5A, a median of the characteristics of the exhaust fan 210 is represented by the solid line. Even when the duty ratio of the PWM signal SIG1 is the same, the rotation speed of the exhaust fan 210 exhibits a variation of ±15% within a range between an upper limit and a lower limit, as shown by the one-dot chain line, due to the variation in characteristics of the exhaust fan 210 and the tolerance of the power supply voltage.

Even when the exhaust fan 210 is driven at the duty ratio (31%) of the PWM signal SIG1 corresponding to the first target rotation speed (2,500 rpm) at the median of the characteristics, the rotation speed of the exhaust fan 210 has a range between 2,875 rpm and 2,125 rpm. Therefore, the exhaust fan 210 can be rotated at the rotation speed within a range between 3,030 rpm being the upper limit rotation speed and 1,825 rpm being the first lower limit rotation speed.

FIG. 5B is a graph for showing a relationship between the duty ratio of the PWM signal SIG1 used when the exhaust fan 210 is rotated at 2,850 rpm being the second target rotation speed and the rotation speed. In a case where the feedback control is not performed, even when the exhaust fan 210 is driven at the duty ratio (36%) of the PWM signal SIG1 corresponding to the second target rotation speed (2,850 rpm) at the median of the characteristics, there is a possibility that the rotation speed of the exhaust fan 210 may have a range between 3,278 rpm to 2,432 rpm. In this case, the rotation speed of the exhaust fan 210 falls out of the range between 3,030 rpm being the upper limit rotation speed and 1,825 rpm being the first lower limit rotation speed. Therefore, the exhaust fan 210 is required to be subjected to the feedback control.

The exhaust fan 210 has the duty ratio of the PWM signal SIG1 adjusted by the feedback control, to thereby be rotated within the range of ±1.8% (2,901 rpm to 2,799 rpm) with respect to the second target rotation speed. This allows the exhaust fan 210 to be rotated at the rotation speed within the range between 3,030 rpm being the upper limit rotation speed and 1,825 rpm being the first lower limit rotation speed.

Figure 6:
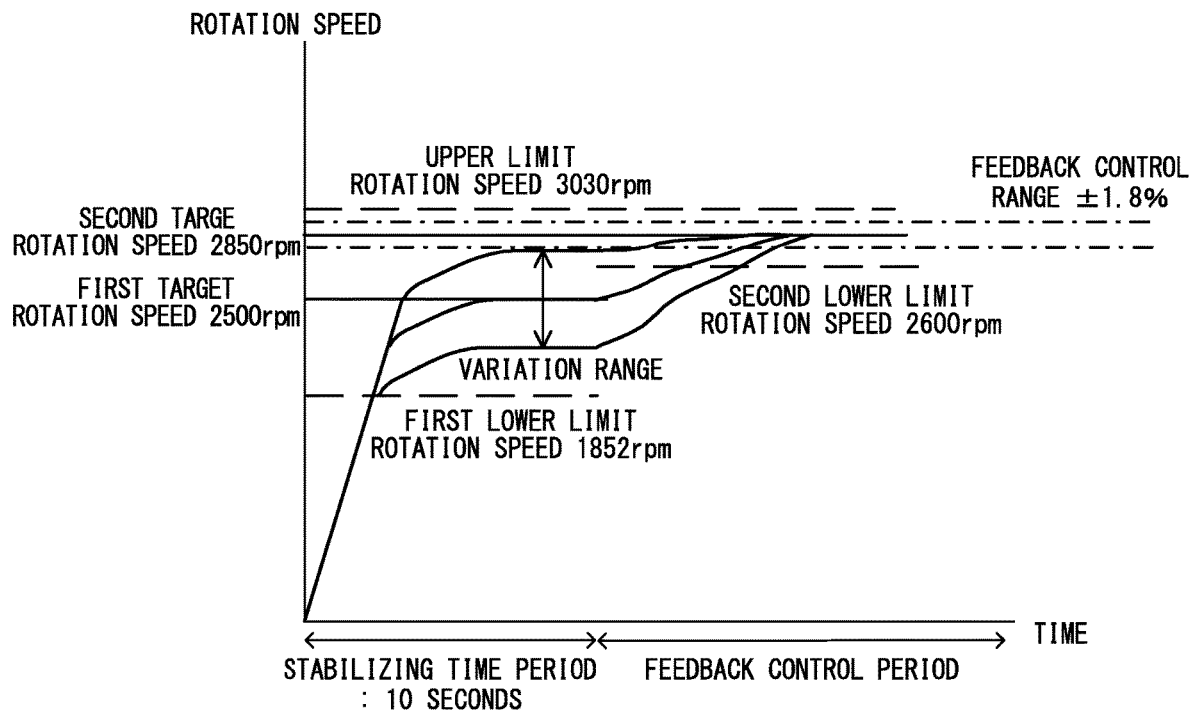
FIG. 6 is an explanatory graph of temporal changes in rotation speed of the exhaust fan.
Figure 7:
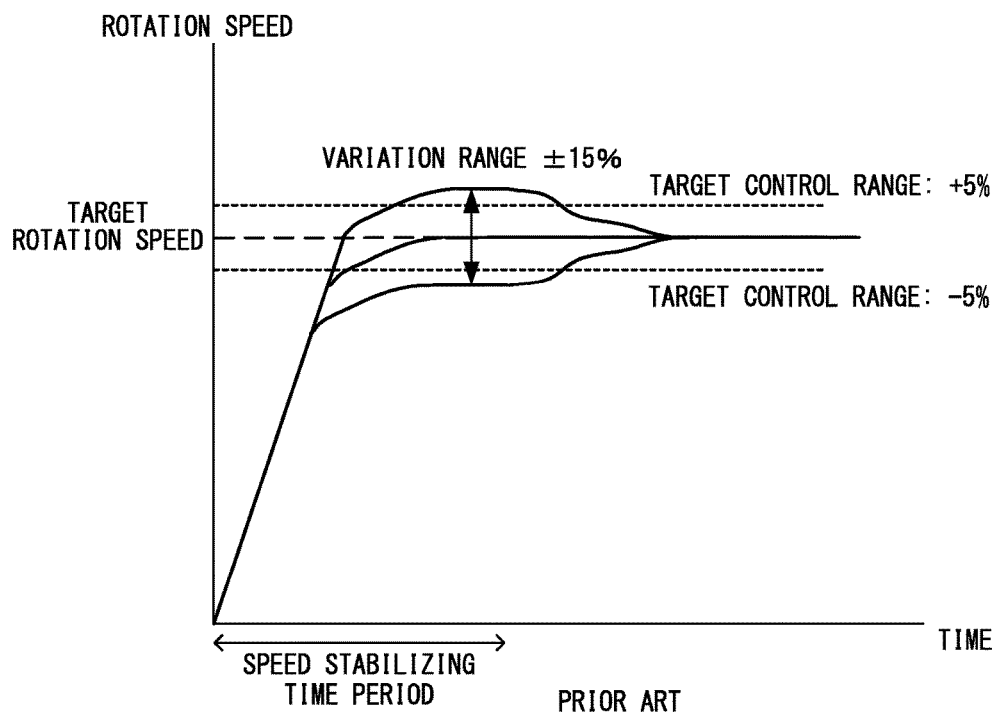
FIG. 7 is an explanatory graph of temporal changes in rotation speed of an exhaust fan in a related art.

FIG. 6 is an explanatory graph of temporal changes in rotation speed of the exhaust fan 210. After being started to be driven at the first target rotation speed (2,500 rpm), the exhaust fan 210 is controlled with the duty ratio of the PWM signal being fixed at 31% during the stabilizing time period (for 10 seconds). After the stabilizing time period has elapsed, the target rotation speed is changed to the second target rotation speed (2,850 rpm). The CPU 201 changes the duty ratio of the PWM signal to perform the feedback control so that the rotation speed of the exhaust fan 210 falls within ±1.8% with respect to the second target rotation speed. When the rotation speed of the exhaust fan 210 falls within ±1.8% with respect to the second target rotation speed by the feedback control, the CPU 201 fixes the duty ratio of the PWM signal at 36%.

Conditions for starting switching of the target rotation speed from the first target rotation speed to the second target rotation speed and for starting the feedback control may be not only the stabilizing time period but also detection that a change in rotation speed for the first target rotation speed has fallen within a predetermined range (for example, ±5%). In this manner, the CPU 201 starts the feedback control when the stabilizing time period for the rotation of the exhaust fan 210, the change in the rotation speed, and other such states of the exhaust fan 210 satisfy the start conditions.

As described above, the printer 100 in this embodiment sets the rotation speed of the exhaust fan 210 to any one of the first target rotation speed and the second target rotation speed, which is faster than the first target rotation speed. The printer 100 controls the rotation of the exhaust fan 210 based on the PWM signal of the fixed duty ratio corresponding to the first target rotation speed until the rotation speed becomes stable. After the rotation speed has become stable, the printer 100 performs the feedback control for the exhaust fan 210 based on the second target rotation speed. Such control enables the printer 100 to control the rotation speed of the exhaust fan 210 within a range of a rotation limit even when the rotation speed exhibits a variation due to the individual differences in characteristics of the exhaust fan 210 and the tolerance of the power supply voltage. The printer 100 does not require adjustment work during work at a factory and during maintenance work even when the rotation speed of the exhaust fan 210 exhibits a variation. Even during a period until the rotation speed becomes stable, the printer 100 can appropriately control the rotation speed of the exhaust fan 210 so as to suppress the UFP discharge amount, reduce the noise, and prevent an occurrence of a failure due to the increase in temperature inside the printer 100.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-093655, filed May 15, 2018 which is hereby incorporated by reference herein in its entirety.

What is claimed is:

1. An image forming apparatus, comprising:
   an image forming unit configured to form an image on a recording material;
   a fan configured to exhaust air inside the image forming apparatus;
   a controller configured to control rotation of the fan; and
   a storage configured to store in advance a first control setting value for rotating the fan at a first target rotation speed,
   wherein the controller is configured to:
   rotate the fan based on the first control setting value;
   permit the image forming unit to form an image in a case where the rotation speed of the fan becomes equal to or faster than a predetermined lower limit rotation speed; and
   perform feedback control for the fan such that the fan is rotated at a second target rotation speed, which is faster than the first target rotation speed, in a case where a state of the fan satisfies a predetermined start condition, and
   wherein a discharge amount of fine particles is suppressed to an amount equal to or smaller than a predetermined amount under a state in which the fan is being rotated at the predetermined lower limit rotation speed.

2. The image forming apparatus according to claim 1,
   wherein the storage is configured to store a second control setting value for rotating the fan at the second target rotation speed, and
   wherein the controller is configured to rotate the fan based on the second control setting value in a case where the rotation speed of the fan falls within a predetermined range with respect to the second target rotation speed by the feedback control.

3. The image forming apparatus according to claim 2,
   wherein the controller is configured to control the rotation of the fan based on a PWM signal, and
   wherein the storage is configured to:
   store, as the first control setting value, a value corresponding to a duty ratio of the PWM signal such that the fan is rotated at the first target rotation speed; and
   store, as the second control setting value, a value corresponding to a duty ratio of the PWM signal such that the fan is rotated at the second target rotation speed.

4. The image forming apparatus according to claim 2,
   wherein the controller is configured to:
   rotate, in a case where the image forming unit forms an image for the first time, the fan based on the first control setting value;
   permit the image forming unit to form an image in a case where the rotation speed of the fan becomes equal to or faster than the predetermined lower limit rotation speed; and perform the feedback control for the fan such that the fan is rotated at the second target rotation speed in a case where the state of the fan satisfies the predetermined start condition, and wherein the controller is configured to:

rotate, in a case where the image forming unit forms an image for the second and subsequent iterations, the fan based on the second control setting value;

permit the image forming unit to form an image in a case where the rotation speed of the fan becomes equal to or faster than the predetermined lower limit rotation speed; and perform the feedback control for the fan such that the fan is rotated at the second target rotation speed in a case where the state of the fan satisfies the predetermined start condition.

5. The image forming apparatus according to claim 1, wherein the storage is configured to store the first control setting value corresponding to the first target rotation speed that falls within a range of from the predetermined lower limit rotation speed to a predetermined upper limit rotation speed even in a case where a variation in rotation speed occurs with respect to the rotation of the fan, and wherein the image forming apparatus is configured to suppress noise due to the fan to an amount equal to or smaller than a second predetermined amount under a state in which the fan is being rotated at the predetermined upper limit rotation speed.

6. The image forming apparatus according to claim 1, wherein the controller is configured to determine, in a case where a predetermined time period has elapsed since a start of the rotation of the fan, that the predetermined start condition has been satisfied to start the feedback control.

7. The image forming apparatus according to claim 6, wherein the controller is configured to determine, in a case where the predetermined time period sufficient for rotating the fan with stability with the rotation speed being the first target rotation speed has elapsed, that the predetermined start condition has been satisfied to start the feedback control for the fan.

8. The image forming apparatus according to claim 1, wherein the controller is configured to determine, in a case where detecting that the rotation speed of the fan falls within a predetermined range with respect to the first target rotation speed, that the predetermined start condition has been satisfied to start the feedback control.

9. The image forming apparatus according to claim 1, wherein the storage is configured to store the first control setting value corresponding to the first target rotation speed that has fallen below the rotation speed for suppressing an increase in temperature inside the image forming apparatus.

10. The image forming apparatus according to claim 1, wherein the fan is configured to output a pulse signal in accordance with the rotation, and wherein the controller is configured to:

detect the rotation speed of the fan based on the pulse signal; and perform the feedback control for the fan based on the detected rotation speed.

11. The image forming apparatus according to claim 1, wherein the controller is configured to determine that an abnormality has occurred in the fan in a case where the rotation speed of the fan does not become equal to or faster than the predetermined lower limit rotation speed even in a case where a second predetermined time period has elapsed.

12. A fan operation controlling method to be executed by an image forming apparatus, the image forming apparatus including:

an image forming unit configured to form an image on a recording material;

a fan configured to exhaust air inside the image forming apparatus;

a storage configured to store in advance a first control setting value for rotating the fan at a first target rotation speed; and a controller, the fan operation controlling method comprising:

rotating, by the controller, the fan based on the first control setting value;

permitting, by the controller, the image forming unit to form an image in a case where a rotation speed of the fan becomes equal to or faster than a predetermined lower limit rotation speed, a discharge amount of fine particles is suppressed to an amount equal to or smaller than a predetermined amount under a state in which the fan is being rotated at the predetermined lower limit rotation speed; and performing, by the controller, feedback control for the fan such that the fan is rotated at a second target rotation speed, which is faster than the first target rotation speed, in a case where a state of the fan satisfies a predetermined start condition.

* * * * *